(12) United States Patent
Cheng

(10) Patent No.: US 12,262,547 B2
(45) Date of Patent: Mar. 25, 2025

(54) SEMICONDUCTOR STRUCTURE AND MANUFACTURING METHOD FOR THE SAME

(71) Applicant: ENKRIS SEMICONDUCTOR, INC., Jiangsu (CN)

(72) Inventor: Kai Cheng, Jiangsu (CN)

(73) Assignee: ENKRIS SEMICONDUCTOR, INC., Jiangsu (CN)

( * ) Notice: Subject to any disclaimer, the term of this patent is extended or adjusted under 35 U.S.C. 154(b) by 600 days.

(21) Appl. No.: 17/613,575

(22) PCT Filed: Jul. 29, 2019

(86) PCT No.: PCT/CN2019/098165
§ 371 (c)(1),
(2) Date: Nov. 23, 2021

(87) PCT Pub. No.: WO2021/016800
PCT Pub. Date: Feb. 4, 2021

(65) Prior Publication Data
US 2022/0246752 A1    Aug. 4, 2022

(51) Int. Cl.
*H10D 30/01*    (2025.01)
*H10D 30/47*    (2025.01)
(Continued)

(52) U.S. Cl.
CPC ......... *H10D 30/477* (2025.01); *H10D 30/015* (2025.01); *H10D 62/824* (2025.01);
(Continued)

(58) Field of Classification Search
CPC ............. H01L 29/7788; H01L 29/2003; H01L 29/205; H01L 29/401; H01L 29/42316;
(Continued)

(56) References Cited

U.S. PATENT DOCUMENTS 7,807,531 B2    10/2010    Sumida
8,558,276 B2    10/2013    Bobde
(Continued)

FOREIGN PATENT DOCUMENTS

CN    101527427 A    9/2009
CN    101930974 A    12/2010
(Continued)

OTHER PUBLICATIONS

ISA State Intellectual Property Office of the People's Republic of China, International Search Report Issued in Application No. PCT/CN2019/098165, Apr. 24, 2020, WIPO, 4 pages.
(Continued)

*Primary Examiner* — Elias Ullah
(74) *Attorney, Agent, or Firm* — The Small Patent Law Group LLC; Christopher R. Carroll

(57) ABSTRACT

The present application provides a semiconductor structure and a manufacturing method thereof. The semiconductor structure includes: a first n-type semiconductor layer, a p-type semiconductor layer, and a second n-type semiconductor layer which are stacked. A buried layer made of AlGaN is disposed in the first n-type semiconductor layer. A trench at least penetrates through the second n-type semiconductor layer and the p-type semiconductor layer. At least part of the buried layer is reserved below the trench. A gate electrode is in the trench. The method is used to manufacture this semiconductor structure.

18 Claims, 8 Drawing Sheets

(51) Int. Cl.
  *H10D 62/824* (2025.01)
  *H10D 62/85* (2025.01)
  *H10D 64/01* (2025.01)
  *H10D 64/27* (2025.01)

(52) U.S. Cl.
  CPC ......... *H10D 62/8503* (2025.01); *H10D 64/01* (2025.01); *H10D 64/411* (2025.01)

(58) Field of Classification Search
  CPC ......... H01L 29/66462; H01L 29/41766; H01L 29/8122; H01L 21/77; H01L 29/78
  See application file for complete search history.

(56) References Cited

U.S. PATENT DOCUMENTS

| | | | |
|---|---|---|---|
| 9,449,669 | B2 | 9/2016 | Luan et al. |
| 9,564,198 | B2 | 2/2017 | Luan et al. |
| 9,748,223 | B2 | 8/2017 | Luan et al. |
| 2006/0131688 | A1 | 6/2006 | Klootwijk |
| 2009/0278172 | A1* | 11/2009 | Kaya .................. H01L 29/4236 257/E29.091 |
| 2009/0321854 | A1* | 12/2009 | Ohta .................. H01L 29/66462 257/411 |
| 2010/0321840 | A1 | 12/2010 | Bobde |
| 2014/0070356 | A1 | 3/2014 | Mauder et al. |
| 2015/0087118 | A1 | 3/2015 | Chiang et al. |
| 2016/0093367 | A1 | 3/2016 | Luan et al. |
| 2016/0093607 | A1 | 3/2016 | Luan et al. |
| 2017/0148782 | A1 | 5/2017 | Luan et al. |
| 2017/0373177 | A1 | 12/2017 | Benkhelifa |

FOREIGN PATENT DOCUMENTS

| | | |
|---|---|---|
| CN | 102208506 A | 10/2011 |
| CN | 103262248 A | 8/2013 |
| CN | 106170832 A | 11/2016 |
| CN | 106206711 A | 12/2016 |
| CN | 107623032 A | 1/2018 |
| CN | 108493242 A | 9/2018 |
| CN | 109728084 A | 5/2019 |
| CN | 110034176 A | 7/2019 |
| JP | 2010232610 A | 10/2010 |
| TW | 201838175 A | 10/2018 |

OTHER PUBLICATIONS

ISA State Intellectual Property Office of the People's Republic of China, Written Opinion of the International Searching Authority Issued in Application No. PCT/CN2019/098165, Apr. 24, 2020, WIPO, 4 pages.(Submitted with Partial/ Machine Translation).
State Intellectual Property Office of the People's Republic of China, First Office Action and Search Report Issued in Application No. 201980098556.X, May 30, 2022, 14 pages. (Submitted with Machine/ Partial Translation).
State Intellectual Property Office of the People's Republic of China, Second Office Action and Search Report Issued in Application No. 201980098556.X, Aug. 15, 2022, 17 pages. (Submitted with Machine/ Partial Translation).
TW Patent Office, Office Action Issued in Application No. 109124905, Nov. 19, 2021, 13 pages.(Submitted with Machine Translation).

* cited by examiner

SEMICONDUCTOR STRUCTURE AND MANUFACTURING METHOD FOR THE SAME

CROSS-REFERENCE TO RELATED APPLICATIONS

This application is a national phase entry of and claims priority to International Patent Application No. PCT/CN2019/098165 (filed 29 Jul. 2019), the entire disclosure of which is incorporated herein by reference.

TECHNICAL FIELD

The present disclosure relates to the field of semiconductors, and in particular to a semiconductor structure and a manufacture method thereof.

BACKGROUND

In the prior art, it is required to deposit a metal by etching a trench so as to form a gate electrode in a process of manufacturing a semiconductor structure. For a semiconductor structure, a depth of a gate electrode may affect performance of an entire device. However, in the traditional manufacture process, since a particular etching depth of a trench cannot be accurately controlled, the particular depth of the gate electrode cannot be accurately controlled. For example, after a trench is etched, when another semiconductor layer is grown by increasing the temperature, a layer structure below the trench is generally made of a GaN material. However, the GaN material may decompose and volatilize due to the increased temperature so that the trench becomes deeper. In this case, the final depth of the trench becomes uncontrollable, thereby affecting the performance of the entire semiconductor device.

SUMMARY

The present disclosure provides a semiconductor structure and a manufacture method thereof to solve the problem of the uncontrollable final depth of the trench.

To achieve the above object, according to a first aspect of embodiments of the present disclosure, there is provided a semiconductor structure. The semiconductor structure includes:
  a first n-type semiconductor layer, a p-type semiconductor layer, and a second n-type semiconductor layer which are stacked, where a buried layer is disposed in the first n-type semiconductor layer, and the buried layer is made of AlGaN;
  a trench, where the trench at least penetrates through the second n-type semiconductor layer and the p-type semiconductor layer, and at least part of the buried layer is reserved below the trench; and
  a gate electrode disposed in the trench.

Optionally, an Al content in the buried layer increases from bottom to top along a growth direction of the buried layer.

Optionally, the Al content in the buried layer increases linearly or increases in steps, or increases in arc shape from bottom to top along the growth direction of the buried layer.

Optionally, a thickness of the buried layer is no less than 0.05 micrometers (µm).

Optionally, the first n-type semiconductor layer includes a first n-type semiconductor sub-layer, the buried layer, and a second n-type semiconductor sub-layer which are stacked.

Optionally, the first n-type semiconductor layer, the second n-type semiconductor layer, and the p-type semiconductor layer all include a GaN-based material.

Optionally, the semiconductor structure further includes a cap layer and a dielectric layer. The cap layer is located in the trench and on the second n-type semiconductor layer, the dielectric layer is located on the cap layer, and the gate electrode is located on the dielectric layer.

Optionally, a material of the cap layer includes the GaN-based material.

Optionally, the first n-type semiconductor layer is a lightly-doped n-type semiconductor layer.

Optionally, the semiconductor structure further includes a heavily-doped n-type semiconductor layer disposed at a lower side of the first n-type semiconductor layer.

Optionally, the semiconductor structure further includes source electrodes and a drain electrode. The source electrodes are disposed at both sides of the gate electrode respectively and kept in contact with the second n-type semiconductor layer. The drain electrode is disposed at the bottom of the first n-type semiconductor layer and kept in contact with the first n-type semiconductor layer.

Optionally, the semiconductor structure further includes a source electrode and a drain electrode. The source electrode is disposed at one side of the gate electrode and kept in contact with the second n-type semiconductor layer. The drain electrode is disposed at the other side of the gate electrode and kept in contact with the first n-type semiconductor layer.

According to a second aspect of embodiments of the present disclosure, there is provided a manufacturing method of a semiconductor structure. The manufacturing method includes:
  sequentially forming a first n-type semiconductor layer, a p-type semiconductor layer, and a second n-type semiconductor layer, where a buried layer is disposed in the first n-type semiconductor layer, and the buried layer is made of AlGaN;
  forming a trench, where the trench at least penetrates through the second n-type semiconductor layer and the p-type semiconductor layer, and at least part of the buried layer is reserved below the trench; and
  forming a gate electrode in the trench.

Optionally, before the gate electrode is formed, the manufacturing method further includes:
  forming a cap layer in the trench and on the second n-type semiconductor layer; and
  forming a dielectric layer on the cap layer.

In the semiconductor structure and the manufacturing method thereof according to the above embodiment, a trench will not penetrate through the buried layer in a process of growing another semiconductor layer at high temperature by disposing a buried layer with AlGaN because AlGaN is not easy to decompose at high temperature. Therefore, the trench will not be lower than the lower surface of the buried layer with AlGaN. In this way, the depth of the trench can be accurately controlled.

BRIEF DESCRIPTION OF THE DRAWINGS

To describe the technical solutions in the embodiments of the present disclosure more clearly, drawings required in descriptions of the embodiments of the present disclosure will be briefly introduced below. It is apparent that the drawings described below are merely some embodiments of the present disclosure and other drawings may also be obtained by those of ordinary skill in the art based on these drawings without paying inventive work.

DETAILED DESCRIPTION OF THE EMBODIMENTS

Figure 1:
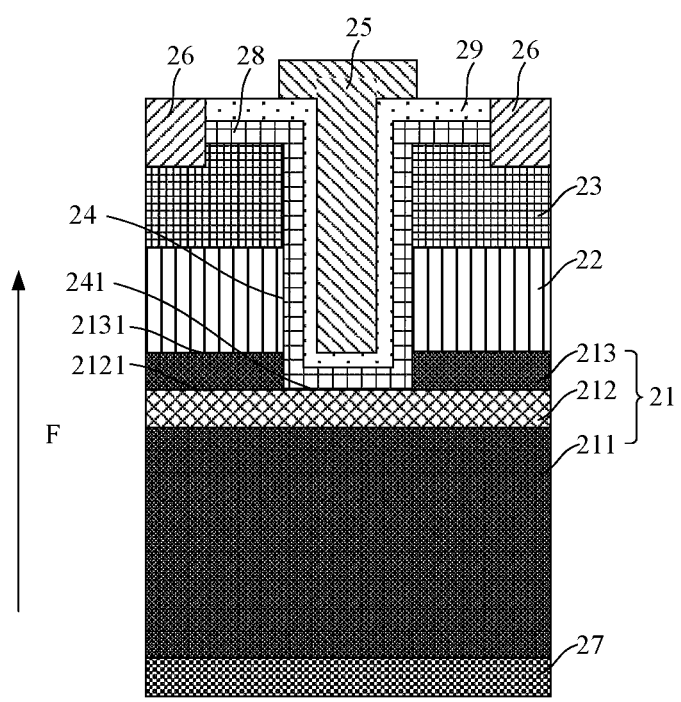
FIG. 1 is a sectional structural schematic diagram of a semiconductor structure according to an embodiment of the present disclosure.

Embodiments will be described in detail herein, with the illustrations thereof represented in the drawings. When the following descriptions involve the drawings, like numerals in different drawings refer to like or similar elements unless otherwise indicated. Implementations described in the following embodiments do not represent all implementations consistent with the present disclosure. Rather, they are merely embodiments of apparatuses and methods consistent with some aspects of the present disclosure as detailed in the appended claims.

Terms used in the present disclosure are for the purpose of describing particular embodiments only, and are not intended to limit the present disclosure. Unless otherwise defined, technical terms or scientific terms used in the present disclosure shall have general meanings understandable by those of ordinary skill in the art. The words such as "one" and "a" used in the specification of the present disclosure and the claims refer to at least one rather than represent number limitation. The words such as "include" and "contain" are intended to indicate that an element or article appearing before "include" or "contain" includes elements or articles or equivalents listed after "include" or "contain", and do not preclude other elements or articles. The words such as "connect" and "couple" are not limited to physical or mechanical connection, and may include direct or indirect electrical connection. The term "a plurality" includes two, which is equivalent to at least two. The singular forms such as "a", 'said", and "the" used in the present disclosure and the appended claims are also intended to include multiple, unless the context clearly indicates otherwise. It is also to be understood that the term "and/or" as used herein refers to any or all possible combinations that include one or more associated listed items.

An embodiment of the present disclosure provides a semiconductor structure. As shown in FIG. 1, the semiconductor structure includes a first n-type semiconductor layer 21, a p-type semiconductor layer 22, a second n-type semiconductor layer 23, a cap layer 28, a dielectric layer 29, a gate electrode 25, a source electrode 26, and a drain electrode 27. The first n-type semiconductor layer 21, the second n-type semiconductor layer 23, the p-type semiconductor layer 22, and the cap layer 28 all include a GaN-based material. The GaN-based material is a material at least including Ga atom and N atom. In this embodiment, the GaN-based material includes GaN, AlGaN and AlInGaN.

The first n-type semiconductor layer 21 is a lightly-doped n-type semiconductor layer, and the light doping refers to that a doping concentration of n-type impurity in the first n-type semiconductor layer 21 is no greater than $2e17\ cm^{-3}$.

The p-type semiconductor layer 22 and the second n-type semiconductor layer 23 are stacked on the first n-type semiconductor layer 21 along a growth direction F. A trench 24 is opened at a side of the second n-type semiconductor layer 23 away from the p-type semiconductor layer 22, and the trench 24 at least penetrates through the second n-type semiconductor layer 23 and the p-type semiconductor layer 22. Particularly, the trench 24 may be formed by etching. In another embodiment, the trench 24 may also be formed by selective growth. The manner in which the trench 24 is formed is not limited herein, and the particular manner in which the trench 24 is formed by etching may be dry etching.

Figure 8:
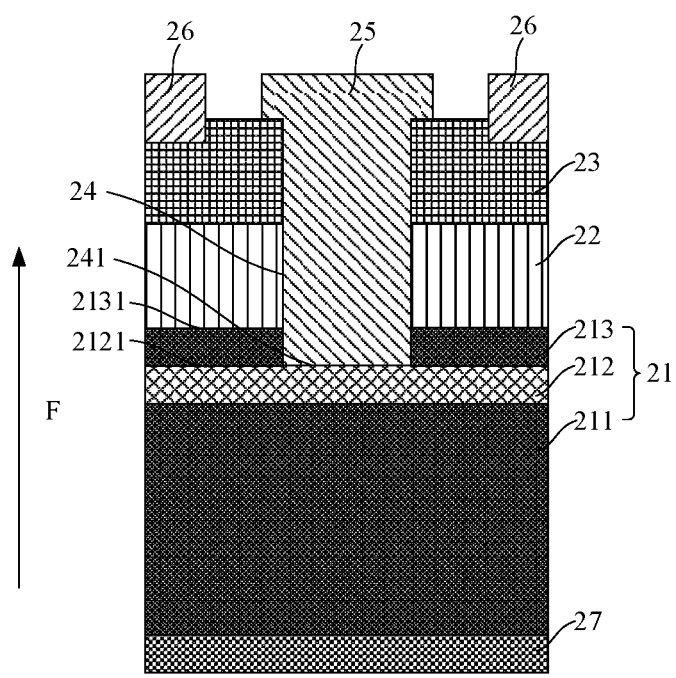
FIG. 8 is a sectional structural schematic diagram of a semiconductor structure in another implementation according to an embodiment of the present disclosure.

In this embodiment, the cap layer 28 is located in the trench 24 and on the second n-type semiconductor layer 23, the dielectric layer 29 is located on the cap layer 28, and the gate electrode 25 is located on the dielectric layer 29. Further, the gate electrode 25 may also be exposed externally to form the T-shaped gate electrode 25, which is not limited herein. In another implementation of this embodiment as shown in FIG. 8, the semiconductor structure may include neither the cap layer 28 nor the dielectric layer 29, and thus the gate electrode 25 may be directly formed in the trench 24.

Figure 5:
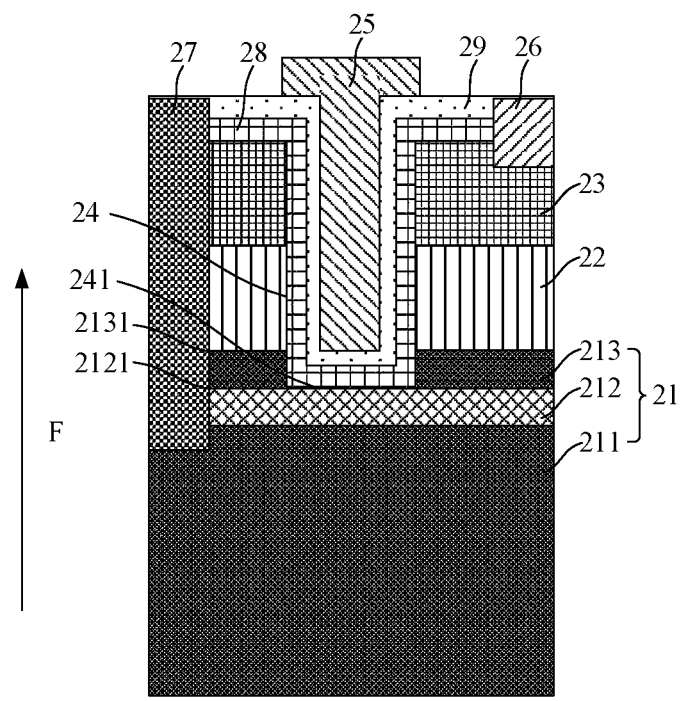
FIG. 5 is a sectional structural schematic diagram of a semiconductor structure according to another embodiment of the present disclosure.

In this embodiment, the source electrodes 26 are disposed at both sides of the gate electrode 25 respectively and kept in contact with the second n-type semiconductor layer 23. The drain electrode 27 is disposed at the bottom of the first n-type semiconductor layer 21 and kept in contact with the first n-type semiconductor layer 21, so as to form a vertical-type semiconductor structure. In another embodiment, as shown in FIG. 5, the source electrode 26 is disposed at one side of the gate electrode 25 and kept in contact with the second n-type semiconductor layer 23. The drain electrode 27 is disposed at the other side of the gate electrode 25 and kept in contact with the first n-type semiconductor layer 21, so as to form a semi-vertical-type semiconductor structure.

The first n-type semiconductor layer 21 includes a first n-type semiconductor sub-layer 211, the buried layer 212 and a second n-type semiconductor sub-layer 213 which are stacked along the growth direction F, where the buried layer 212 is made of AlGaN.

The trench 24 at least penetrates through the second n-type semiconductor layer 23 and the p-type semiconductor layer 22, and at least part of the buried layer 212 is reserved below the trench 24. Specifically, there are several cases as follows: a bottom 241 of the trench may stop at an upper surface 2131 of the second n-type semiconductor sub-layer 213, the bottom 241 of the trench may partially penetrate through the second n-type semiconductor sub-layer 213, the bottom 241 of the trench may stop at an upper surface 2121 of the buried layer 212, and the bottom 241 of the trench may partially penetrate through the buried layer 212. In summary, the bottom 241 of the trench does not penetrate through the buried layer 212 in all of the above several cases, that is, a part of the buried layer 212 is always reserved below the trench 24. In this case, by disposing the buried layer 212 with AlGaN, the trench 24 will not penetrate through the buried layer 212 in a subsequent process of growing the cap layer 28 or another semiconductor layer at high temperature, because AlGaN is not easy to decompose at high temperature. Therefore, the trench 24 will not be lower than the lower surface of the buried layer 212. In this way, the depth of the trench 24 can be accurately controlled. Further, when there is a particular design requirement for the depth of the trench 24, the depth of the trench 24 can be accurately controlled by setting a particular position of the buried layer 212 in the first n-type semiconductor layer 21, to satisfy the designing requirements.

In this embodiment, the components of the AlGaN remain unchanged. In another embodiment, preferably, an Al content in the buried layer 212 increases from bottom to top along the growth direction F of the buried layer 212. Particularly, the Al content in the buried layer 212 increases linearly or increases in steps, or increases in arc shape from bottom to top along the growth direction F of the buried layer 212. In this way, the Al content in the buried layer 212 becomes the largest at a position closest to the second n-type semiconductor sub-layer 213 and is most difficult to decompose at high temperature. Therefore, the decomposition of the buried layer 212 at high temperature can be better prevented, and the depth of the trench 24 can be accurately controlled.

In this embodiment, a thickness of the buried layer 212 is no less than 0.05 μm.

Figure 6:
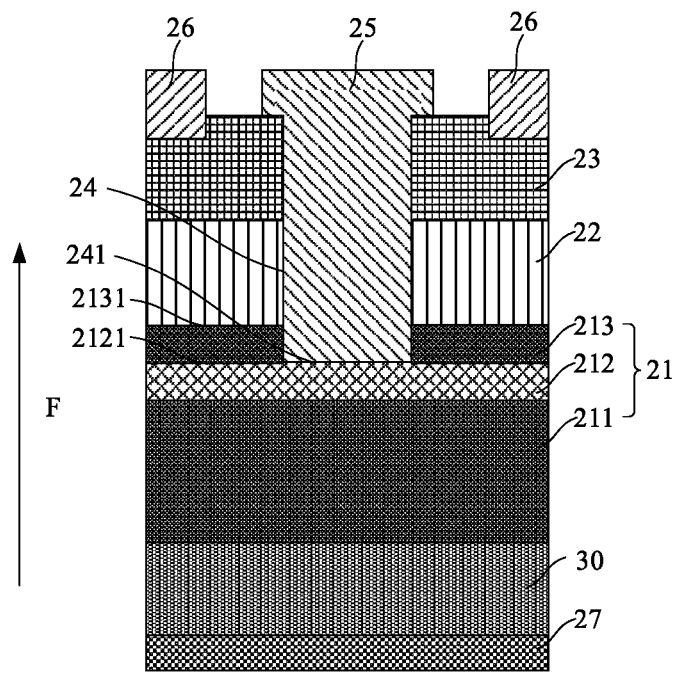
FIG. 6 is a sectional structural schematic diagram of a semiconductor structure according to still another embodiment of the present disclosure.

Further, as shown in FIG. 6, a heavily-doped n-type semiconductor layer 30 may also be disposed at a lower side of the first n-type semiconductor layer 21 to reduce a pressure drop, and a doping concentration of n-type impurity in the heavily-doped n-type semiconductor layer 30 is no less than $5e17$ cm$^{-3}$.

Figure 7:
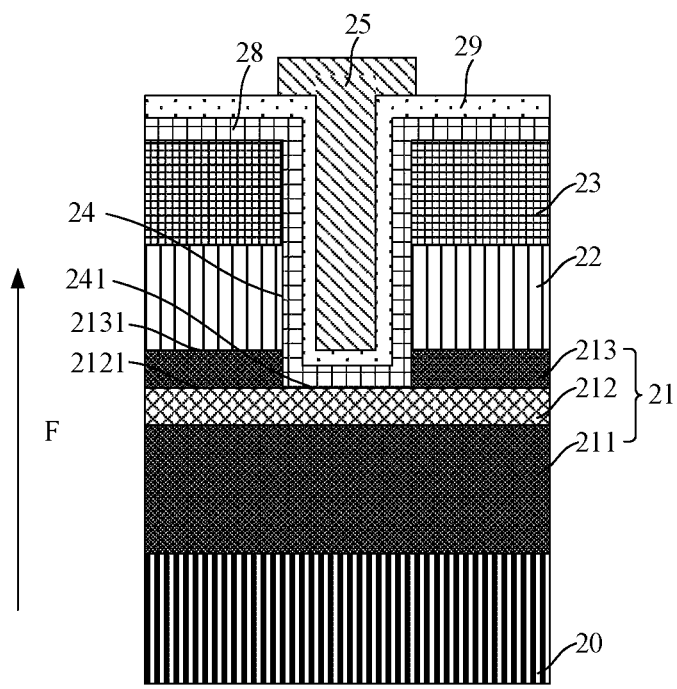
FIG. 7 is a sectional structural schematic diagram of a semiconductor structure according to yet another embodiment of the present disclosure.

Further, as shown in FIG. 7, the semiconductor structure may further include a substrate 20, and the substrate 20 is disposed at the lower side of the first n-type semiconductor layer 21 to form the first n-type semiconductor layer 21 at its upper side.

Figure 2:
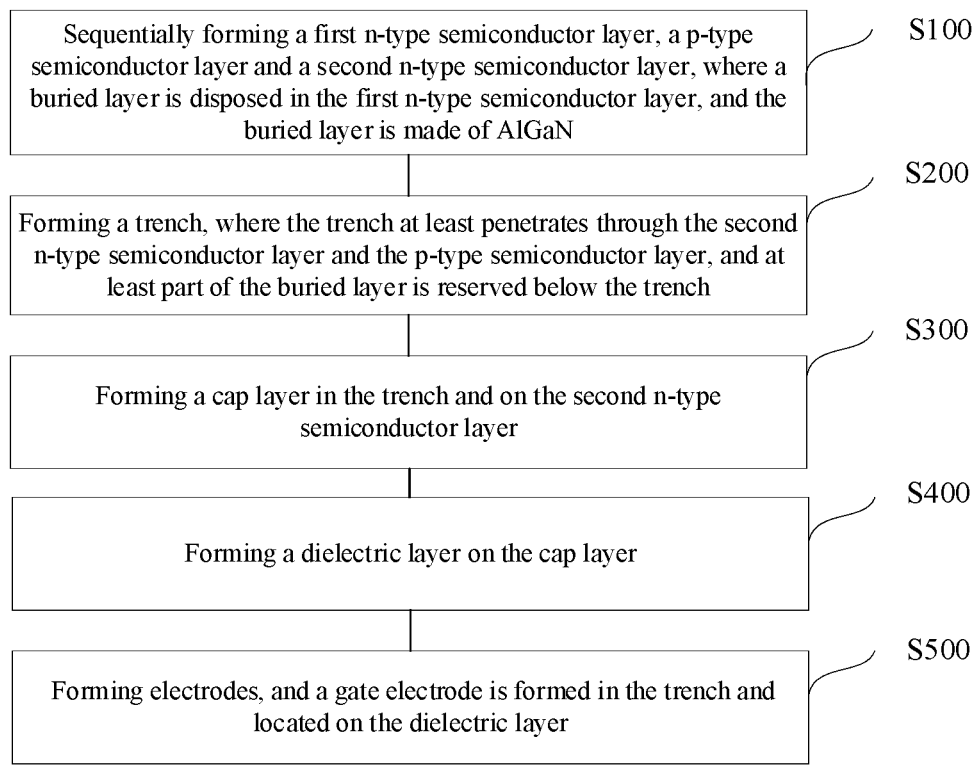
FIG. 2 is a flowchart of a method of manufacturing a semiconductor structure according to an embodiment of the present disclosure.

As shown in FIG. 2, an embodiment of the present disclosure further provides a manufacturing method of a semiconductor structure. The manufacturing method includes the following steps.

At step 100, a first n-type semiconductor layer, a p-type semiconductor layer, and a second n-type semiconductor layer are sequentially formed, where a buried layer is disposed in the first n-type semiconductor layer, and the buried layer is made of AlGaN.

At step 200, a trench is formed, where the trench at least penetrates through the second n-type semiconductor layer and the p-type semiconductor layer, and at least part of the buried layer is reserved below the trench.

At step 300, a cap layer is formed in the trench and on the second n-type semiconductor layer.

At step 400, a dielectric layer is formed on the cap layer.

At step 500, electrodes are formed, and a gate electrode is formed in the trench and located on the dielectric layer.

Figure 3A:
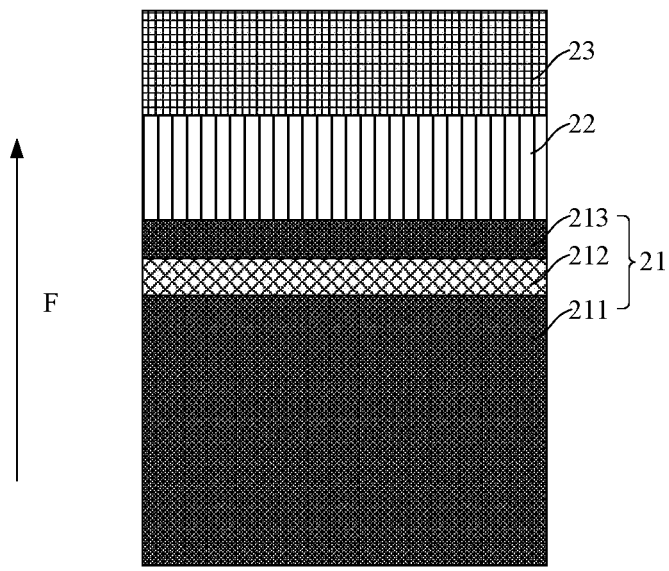
FIG. 3(a) to FIG. 3(f) are process flowcharts of a method of manufacturing a semiconductor structure according to an embodiment of the present disclosure.

At step 100, as shown in FIG. 3(a), the first n-type semiconductor layer 21, the p-type semiconductor layer 22 and the second n-type semiconductor layer 23 are sequentially formed along a growth direction F. The first n-type semiconductor layer 21 includes a first n-type semiconductor sub-layer 211, a buried layer 212, and a second n-type semiconductor sub-layer 213 which are stacked along the growth direction F, where the buried layer 212 is AlGaN.

Figure 3B:
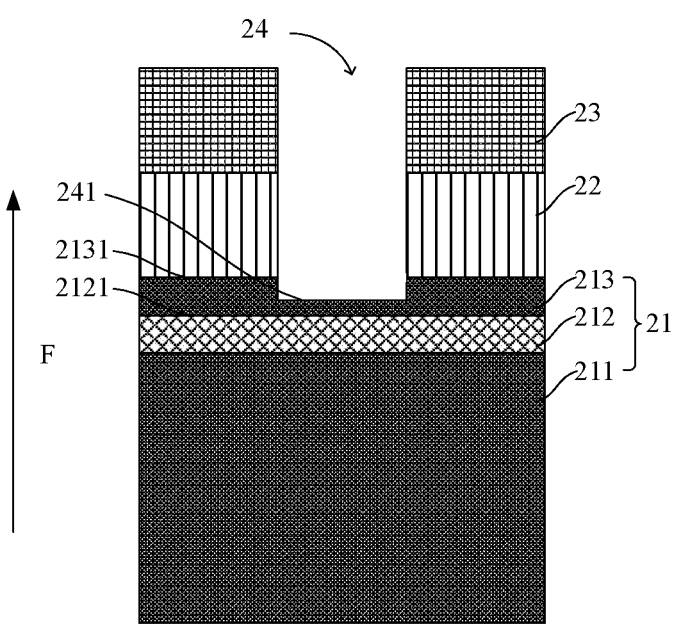
Figure 3C:
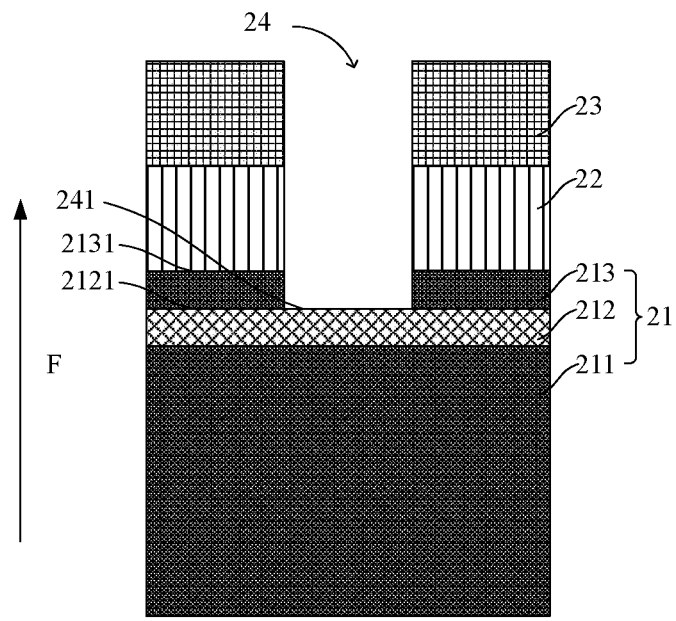

At step 200, as shown in FIG. 3(b) and FIG. 3(c), the trench 24 is formed at a side of the second n-type semiconductor layer 23 away from the p-type semiconductor layer 22. The trench 24 may be formed by, for example, etching, or may be formed by selective growth. A manner in which the trench 24 is formed is not limited herein. A particular manner in which the trench 24 is formed by etching may be dry etching.

The trench 24 at least penetrates through the second n-type semiconductor layer 23 and the p-type semiconductor layer 22, and at least part of the buried layer 212 is reserved below the trench 24. Specifically, there are several cases as follows: a bottom 241 of the trench may stop at an upper surface 2131 of the second n-type semiconductor sub-layer 213, the bottom 241 of the trench may partially penetrate through the second n-type semiconductor sub-layer 213, as shown in FIG. 3(b), the bottom 241 of the trench may stop at an upper surface 2121 of the buried layer 212, as shown in FIG. 3(c), or the bottom 241 of the trench may partially penetrate through the buried layer 212. In summary, the bottom 241 of the trench does not penetrate through the buried layer 212 in all of the above several cases, that is, a part of the buried layer 212 is always reserved below the trench 24. In this case, by deposing the buried layer 212 with AlGaN, the trench 24 will not penetrate through the buried layer 212 in a process of growing the cap layer 28 at high temperature, because AlGaN is not easy to decompose at high temperature. Therefore, the depth of the trench 24 will not be lower than the buried layer 212. In this way, the depth of the trench 24 is accurately controlled. Further, when there is a particular design requirement for the depth of the trench 24, the depth of the trench 24 can be accurately controlled by setting a particular position of the buried layer 212 in the first n-type semiconductor layer 21, to satisfy the designing requirements.

Figure 3D:
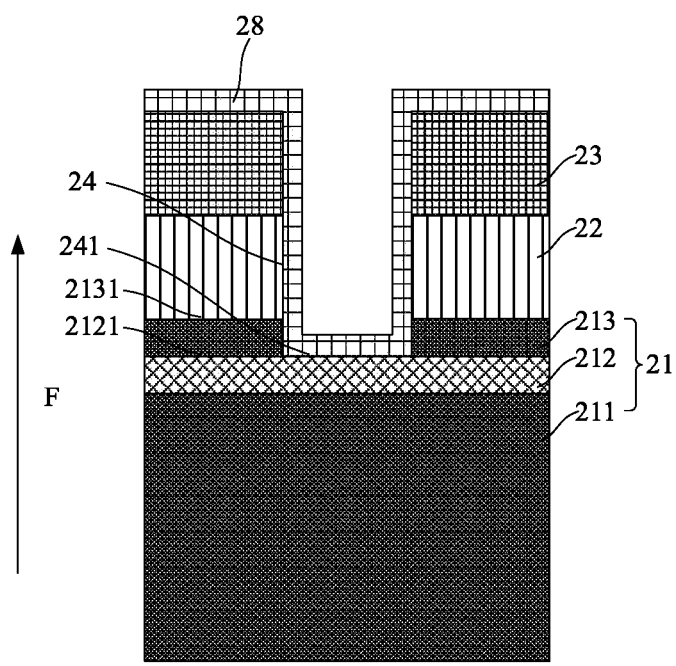

At step 300, as shown in FIG. 3(d), the cap layer 28 is formed in the trench 24 and on the second n-type semiconductor layer 23. In the process of forming the cap layer 28, the cap layer 28 may be formed by high-temperature growth.

Figure 3E:
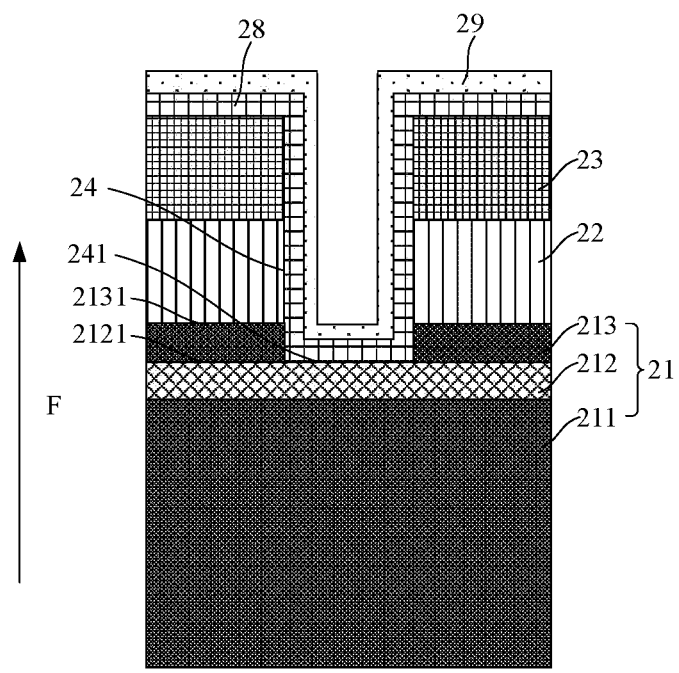

At step 400, as shown in FIG. 3(e), the dielectric layer 29 is formed on the cap layer 28, and likewise, a part of the dielectric layer 29 is also located in the trench 24.

Figure 3F:
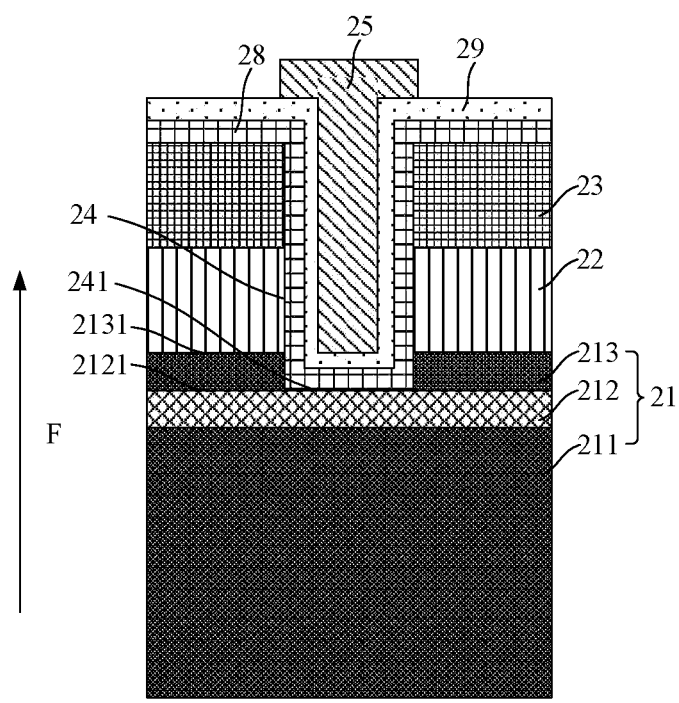

At step 500, as shown in FIG. 3(f), electrodes are formed, and the gate electrode 25 is formed in the trench 24 and located on the dielectric layer 29.

Figure 4:
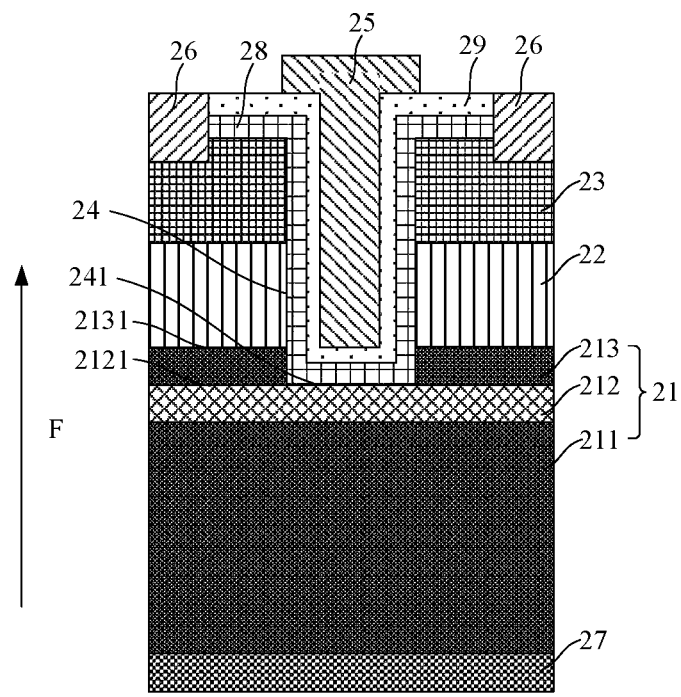
FIG. 4 is a sectional structural schematic diagram of a semiconductor structure according to an embodiment of the present disclosure.

In the process of forming the electrodes, as shown in FIG. 4, the source electrodes 26 are formed on the second n-type semiconductor layer 23, located at both sides of the gate electrode 25 respectively, and kept in contact with the second n-type semiconductor layer 23. The drain electrode 27 is formed at the bottom of the first n-type semiconductor layer 21 and kept in contact with the first n-type semiconductor layer 21 so as to form a vertical-type semiconductor structure. It may be understood that when a heavily-doped n-type semiconductor layer 30 is disposed at a lower side of the first n-type semiconductor layer 21, the drain electrode 27 may also be in contact with the heavily-doped n-type semiconductor layer 30 to form the vertical-type semiconductor structure, as shown in FIG. 6.

In another embodiment, the electrodes may also be formed as shown in FIG. 5. The source electrode 26 is disposed at one side of the gate electrode 25 and kept in contact with the second n-type semiconductor layer 23. The drain electrode 27 is disposed at the other side of the gate electrode 25 and kept in contact with the first n-type semiconductor layer 21 to form a semi-vertical-type semiconductor structure. Particularly, firstly, at one side of the gate electrode 25, front-side etching method is used until etching the second n-type semiconductor layer 23 is exposed, to form the source electrode 26, so that the source electrode 26 is in contact with the second n-type semiconductor layer 23. Then, at the other side of the gate electrode 25, front-side etching method is used until etching the first n-type semiconductor layer 21 is exposed to form the drain electrode 27 so that the drain electrode 27 is in contact with the first n-type semiconductor layer 21.

In another embodiment, as shown in FIG. 6, the heavily-doped n-type semiconductor layer 30 may also be disposed at the lower side of the first n-type semiconductor layer 21 to reduce a pressure drop. The doping concentration of n-type impurity in the heavily-doped n-type semiconductor layer 30 is no less than 5e17 cm$^{-3}$.

In another embodiment, the manufacturing method further includes sequentially forming the first n-type semiconductor layer 21, the p-type semiconductor layer 22, and the second n-type semiconductor layer 23 on a substrate 20, as shown in FIG. 7, and forming the vertical-type semiconductor structure as shown in FIG. 4 by removing the substrate 20 before the drain electrode 27 is formed. It may be understood that, the semi-vertical-type semiconductor structure as shown in FIG. 5 may also be formed. In another implementation of this embodiment, the manufacturing method of the semiconductor structure may include neither step 300 nor step 400, that is, the step 500, at which the electrodes are formed and the gate electrode is formed in the trench, may be directly performed after step 200 is completed. The semiconductor structure obtained by the manufacture method is as shown in FIG. 8.

In the semiconductor structure and the manufacturing method thereof in the above embodiments, by deposing the buried layer with AlGaN, the trench will not penetrate through the buried layer in a process of growing another semiconductor layer at high temperature, because AlGaN is not easy to decompose at high temperature. Therefore, the trench will not be lower than the lower surface of the buried layer with AlGaN. In this way, the depth of the trench is accurately controlled.

The foregoing disclosure is merely illustrative of preferred embodiments of the present disclosure but not intended to limit the present disclosure, and any modifications, equivalent substitutions, adaptations thereof made within the spirit and principles of the present disclosure shall be encompassed in the scope of protection of the present disclosure.

The invention claimed is:

1. A semiconductor structure, comprising:
   a first n-type semiconductor layer, a p-type semiconductor layer, and a second n-type semiconductor layer which are stacked, wherein the first n-type semiconductor layer comprises a first n-type semiconductor sub-layer, a buried layer, and a second n-type semiconductor sub-layer which are sequentially stacked, and the buried layer is made of AlGaN;
   a trench, wherein the trench at least penetrates through the second n-type semiconductor layer and the p-type semiconductor layer, and at least part of the buried layer is below a bottom of the trench; and
   a gate electrode disposed in the trench;
   wherein an Al content in the buried layer increases from bottom to top along a growth direction of the buried layer.

2. The semiconductor structure according to claim 1, wherein the Al content in the buried layer increases linearly, increases in steps, or increases in arc shape from bottom to top along the growth direction of the buried layer.

3. The semiconductor structure according to claim 1, wherein a thickness of the buried layer is no less than 0.05 μm.

4. The semiconductor structure according to claim 1, wherein the first n-type semiconductor layer, the second n-type semiconductor layer, and the p-type semiconductor layer all comprise a GaN-based material.

5. The semiconductor structure according to claim 1, further comprising:
   a cap layer; and
   a dielectric layer, wherein the cap layer is in the trench and on the second n-type semiconductor layer, the dielectric layer is on the cap layer, and the gate electrode is on the dielectric layer.

6. The semiconductor structure according to claim 5, wherein a material of the cap layer comprises a GaN-based material.

7. The semiconductor structure according to claim 1, wherein the first n-type semiconductor layer is a lightly-doped n-type semiconductor layer.

8. The semiconductor structure according to claim 1, further comprising:
   a heavily-doped n-type semiconductor layer disposed at a lower side of the first n-type semiconductor layer.

9. The semiconductor structure according to claim 8, wherein a doping concentration of n-type impurity in the heavily-doped n-type semiconductor layer is no less than 5e17 cm$^{-3}$.

10. The semiconductor structure according to claim 1, further comprising:
    source electrodes and a drain electrode, wherein the source electrodes are disposed at both sides of the gate electrode respectively and kept in contact with the second n-type semiconductor layer, the drain electrode is disposed at a bottom of the first n-type semiconductor layer and kept in contact with the first n-type semiconductor layer.

11. The semiconductor structure according to claim 1, further comprising:
    a source electrode and a drain electrode, wherein the source electrode is disposed at one side of the gate electrode and kept in contact with the second n-type semiconductor layer, the drain electrode is disposed at another side of the gate electrode and kept in contact with the first n-type semiconductor layer.

12. A method of manufacturing the semiconductor structure according to claim 1, comprising:
    sequentially forming a first n-type semiconductor layer, a p-type semiconductor layer, and a second n-type semiconductor layer, wherein the first n-type semiconductor layer comprises a first n-type semiconductor sub-layer, a buried layer, and a second n-type semiconductor sub-layer which are sequentially stacked, and the buried layer is made of AlGaN;
    forming a trench, wherein the trench at least penetrates through the second n-type semiconductor layer and the p-type semiconductor layer, and at least part of the buried layer is reserved below a bottom of the trench; and
    forming a gate electrode in the trench;
    wherein an Al content in the buried layer increases from bottom to top along a growth direction of the buried layer.

13. The method of manufacturing a semiconductor structure according to claim 12, wherein before the gate electrode is formed, the method further comprises:
forming a cap layer in the trench and on the second n-type semiconductor layer; and
forming a dielectric layer on the cap layer.

14. The method of manufacturing a semiconductor structure according to claim 13, wherein forming the gate electrode in the trench comprises:
forming the gate electrode on the dielectric layer.

15. The method of manufacturing a semiconductor structure according to claim 12, the method further comprising:
forming source electrodes on the second n-type semiconductor layer, wherein the source electrodes are located at both sides of the gate electrode respectively, and kept in contact with the second n-type semiconductor layer; and
forming a drain electrode at a bottom of the first n-type semiconductor layer, wherein the drain electrode is kept in contact with the first n-type semiconductor layer.

16. The method of manufacturing a semiconductor structure according to claim 12, the method further comprising:
disposing a source electrode at one side of the gate electrode, wherein the source electrode is kept in contact with the second n-type semiconductor layer; and
disposing a drain electrode at the other side of the gate electrode, wherein the drain electrode is kept in contact with the first n-type semiconductor layer.

17. The method of manufacturing a semiconductor structure according to claim 12, the method further comprising:
disposing a heavily-doped n-type semiconductor layer at the lower side of the first n-type semiconductor layer.

18. The semiconductor structure according to claim 1, wherein an Al content in the buried layer is constant.

* * * * *